United States Patent [19]

Savoye

[11] Patent Number: 4,580,169

[45] Date of Patent: Apr. 1, 1986

[54] CCD IMAGER WITH PHOTOCONVERSION IN AN IMAGE REGISTER CLOCKED WITH A REDUCED NUMBER OF CLOCK PHASES DURING IMAGE TRANSFER

[75] Inventor: Eugene D. Savoye, Lancaster, Pa.

[73] Assignee: RCA Corporation, Princeton, N.J.

[21] Appl. No.: 681,437

[22] Filed: Dec. 12, 1984

[51] Int. Cl.[4] .............................................. H04N 3/15
[52] U.S. Cl. ...................................... 358/213; 357/24
[58] Field of Search .................. 358/213, 209, 41, 44; 357/24 LR; 250/578; 377/78, 57; 307/311, 607

[56] References Cited

U.S. PATENT DOCUMENTS

4,280,141 7/1981 McCann et al. ..................... 358/213
4,481,538 11/1984 Battson et al. ...................... 358/213
4,507,684 3/1985 Battson ............................... 358/213

Primary Examiner—Thomas W. Brown
Assistant Examiner—Robert G. Lev
Attorney, Agent, or Firm—Joseph S. Tripoli; George E. Haas; Allen L. Limberg

[57] ABSTRACT

A CCD imager of field transfer type having an image register statically clocked during image integration in a number of phases greater than it is dynamically clocked with during field transfer to a field storage register, when the image register and the field storage register are clocked in synchronous phase with each other.

8 Claims, 6 Drawing Figures

CCD IMAGER WITH PHOTOCONVERSION IN AN IMAGE REGISTER CLOCKED WITH A REDUCED NUMBER OF CLOCK PHASES DURING IMAGE TRANSFER

The invention relates to CCD imagers of field transfer type and, more particularly, to the clocking of their image (or A) registers during image integration and field transfer time intervals.

BACKGROUND OF THE INVENTION

To obtain perfect interlacing of lines in alternate field scans of the video signal generated by a CCD imager, and at the same time to avoid attendant flicker, it is preferable to clock the image register with a clocking signal having an even number of clock phases. Two-phase clocking and variants thereof (uni-phase clocking, etc.) have not been completely satisfactory, because in order to establish direction of charge transfer it is necessary to differentially dope the semiconductive material in which the CCD charge transfer channels repose. Furthermore, a short-through between gate electrodes consecutive in the same polysilicon level, which could be tolerated in a multi-phase CCD, renders a two-phase CCD useless. Four-phase clocking requires a substantially more complex clocking generator than clocking with fewer phases. This increased complexity of clocking generation is required, not only for the image (or A) register of the field-transfer CCD imager, but also for its field storage (or B) register which is synchronously clocked with the A register during field transfer and for its output line (or C) register(s). Clock generation is even more complex when six-phase clocking is considered. Increasing the number of clocking phases for the A, B and C registers undesirably complicates the bussing of the clocking signals in the CCD imager, as well.

For these reasons CCD imagers of field transfer type are commonly operated with three-phase clocking, and perfect interlacing of lines in alternate field scans is approximated with varying degrees of success by one of several known methods. "Two-thirds interlacing" may be used, for example; or there can be control of image register clocking voltage amplitudes as described by D. F. Battson in U.S. Pat. No. 4,507,684 issued Mar. 26, 1985, entitled REDUCING GRAIN IN MULTI-PHASE-CLOCKED CCD IMAGERS and assigned to RCA Corporation. A fairly standard CCD imager fabrication technology for visible light CCD imagers has evolved at RCA Corporation. It uses three levels of polysilicon in which to form the gate electrodes receptive of the three clock phasings of the A, B and C registers. Charge transfer channels are buried, and the CCD imager is thinned to facilitate back-side illumination. Integrated-circuit clock generation circuitry for such CCD imagers has been developed and finds fairly standard usage with CCD imagers manufactured by RCA Corporation.

The compromise of three-phase clocking has been acceptable so long as CCD imager size has been relatively small (eight millimeter image diagonal or less), as has been the case for surveillance and portable broadcast cameras. But in the design of broadcast television studio cameras, the desire for increased resolution without sacrifice in imager sensitivity dictates a larger image size. Furthermore, there is a desire to use camera optics already commercially available for use with vidicons. These optics are designed for an eleven millimeter image diagonal. Battson in U.S. Pat. No. 4,507,684 has linked the problem of "grain" to partitioning noise associated with the gate electrode (or succession of gate electrodes) biased to establish a barrier between adjacent imager picture elements (pixels). Grain is acceptable as a practical rule-of-thumb so long as barrier length does not exceed five to seven microns. As image-register pixel size increases beyond twenty microns or so, using gate electrodes of substantially equal length in the direction of charge transfer three-phase clocking for all phases of clocking will result in the charge packets representative of image samples being excessively contaminated with partitioning noise. Images reconstructed from video signal response to these charge packets will be excessively grainy.

Accordingly, there has been a reconsideration by the inventor of the use of a greater number of clock phases in the image register of the CCD imager. This reconsideration has been made mindful of the fact that is undesirable from an economic viewpoint to have to develop a new silicon fabrication technology or to have to design completely new integrated clock generation circuitry.

SUMMARY OF THE INVENTION

The invention derives from the insight that the image register of a larger-than-8 mm-diagonal field-transfer CCD imager should be operated to have a greater number (e.g., four or six) of static clock phases in the image integration intervals and to have a lesser number (e.g., three) of dynamic clock phases in the field transfer interval. This permits the clocking of the image register and field storage register in synchronism during field transfer to proceed without impediment, but also permits image integration to be done with the increased number of static clocking phases required to keep grain acceptably low.

BRIEF DESCRIPTION OF THE DRAWING

FIG. 1 is a block diagram of a television camera embodying the invention, and the remaining figures each are successions of charge profiles encountered in the image register and storage register when the camera is operated to provide line interlace on alternate fields in accordance with the invention.

Figure 1:
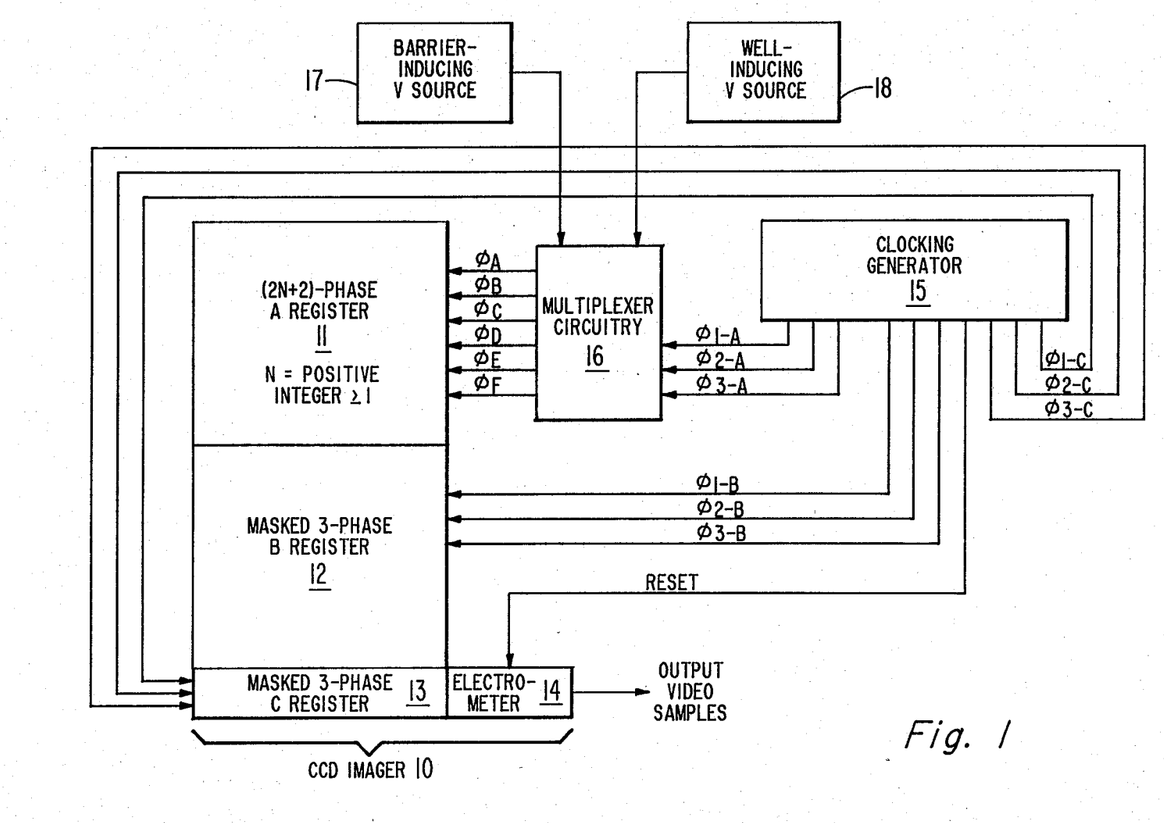

In FIG. 1 CCD image 10 is field-transfer-type imager having an image (or A) register 11 into which an optical system (not shown) projects an optical image of the scene to be televised, having a field storage (or B) register 12 shielded from light, having an output line (or C) register 13 also shielded from light and used for parallel-in-time to serial-in-time conversion of image samples, and having electrometer output stage 14 from which output video voltage samples are supplied responsive to the image samples serially supplied by the C register 13. B register 12 and C register 13 are clocked three-phase during charge transfer through them. CCD imager 10 is novel in that its A register 11 has gate electrodes receptive of an even number of clock phases, greater than the three clock phases employed in the image register of the prior art field transfer CCD imager with three-phase B and C registers.

Clocking generator 15 is of the type conventionally used with prior art CCD imagers having three-phasing clocking of their A, B and C registers. During field trace intervals B register 12 is supplied three successive-in-time phases $\phi_{1-B}$, $\phi_{2-B}$, and $\phi_{3-B}$ of line-advance-rate clocking signal. This advances charge packets a row at a time from B register 12 into respective ones of the successive charge transfer stages of C register 13 during line retrace intervals when C register 13 clocking is halted. During line trace intervals clocking generator 15 supplies C register 13 three successive-in-time phases $\phi_{1-C}$, $\phi_{2-C}$, and $\phi_{3-C}$ of picture-element-scan-rate clocking signal. C register 13 responds to transfer charge packets serially to electrometer output stage 14 during line trace, and clocking generator 15 supplies periodic reset pulses after each charge transfer to electrometer output stage 14 to control reset clamping of the floating element electrometer output stage 14 interposed into C register 13 for sensing charge. During a portion of the line retrace time interval following each field trace time interval, which portion is referred to as the "field transfer interval", clocking generator 13 supplies higher rate three-phase clocking $\phi_{1-B}$, $\phi_{2-B}$, and $\phi_{3-B}$ to B register 12 and supplies similar rate three-phase clocking $\phi_{1-A}$, $\phi_{2-A}$, and $\phi_{3-A}$ for application to the CCD imager A register. During field transfer intervals clocking generator 15 supplies $\phi_{1-A}$ synchronous in phase with $\phi_{1-B}$, $\phi_{2-A}$ synchronous in phase with $\phi_{2-B}$; and $\phi_{3-A}$ synchronous in phase with $\phi_{3-B}$.

In the FIG. 1 camera, multiplexer circuitry is used to apply $\phi_{1-A}$, $\phi_{2-A}$, and $\phi_{3-A}$ supplied by clocking generator 15 during field transfer interval to the gate electrodes of A register 11 in a way similar, if not identical to one of ways to be described in particularity further on in this disclosure with the aid of the higher-numbered figures of the drawing. During each image integration interval between a successive pair of field transfer intervals multiplexer circuitry 16 applies barrier-inducing potential from source 17 and well-inducing potential from source 18 to selected ones of the gate electrodes of image register 11 in a manner similar, if not identical, to one of the ways to be described in particularity further on in this disclosure with the aid of the higher-numbered figures of the drawing.

Where line interlace on alternate fields is not employed, a number of ways are feasible for integrating image on a four-phase basis in A register 11 and transferring the charge packets representative of image samples from A register 11 to B register 12 on a three-phase basis. When line interlace is employed, to avoid complexity in the multiplexer circuitry 16, it is preferable that the same sequence of dynamic clocking signals be supplied to A register 11 and B register 12 during every field transfer interval. This preference restricts the number of ways that A register 11 and B register 12 can be clocked.

Figure 2:
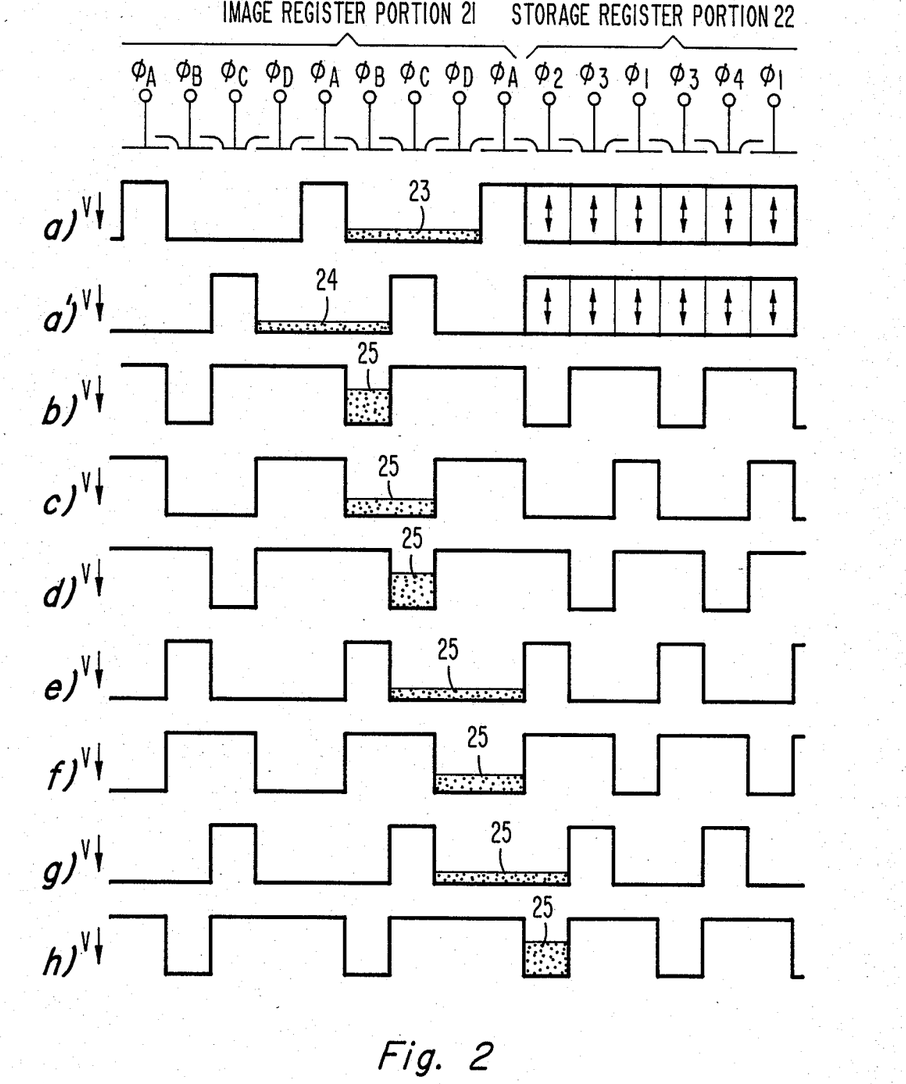
FIGS. 2 and 3 show alternative paired sets of in-channel charge profiles occurring during alternate fields when the image register is operated four-phase during image integration and three-phase during image transfer.

FIG. 2 shows a succession of in-channel charge profiles for cascaded charge transfer channels in a portion 21 of image register 11 and a portion 22 of field storage register 12, respectively, that are clocked in accordance with one of the preferred ways. In every field, image register 11 has static four-phase clocking during image integration and has dynamic three-phase clocking during field transfer. SUBFIG. 2(a) shows the charge profile during image integration for a first set of alternate fields, and SUBFIG. 2(a') shows the charge profile during image integration for a second set of alternate field time-interlaced with the first set of alternate fields. In the first set of alternate fields barrier potentials defining the boundaries between pixels are induced under the last gate electrode of image register 11 and every fourth preceding gate electrode (those gate electrodes labelled as being receptive of $\phi_A$ clock phase) responsive to multiplexer circuitry 16 connecting voltage source 17 to those gate electrodes. During this first set of alternate fields multiplexer circuitry 16 connects voltage source 18 to the other gate electrodes which receive $\phi_{B1}$, $\phi_C$ and $\phi_D$ clock phases. In the second set of alternate fields barrier potentials defining the boundaries between pixels are induced in the second from last gate electrode of image register 11 and every fourth preceding gate electrode (those gate electrodes labelled as being receptive of $\phi_C$ clock phase) responsive to multiplexer circuitry 16 connecting voltage source 17 to these gate electrodes. During this second set of alternate fields multiplexer circuitry 16 connects voltage source 18 to the other gate electrodes which receive $\phi_{1-A}$, $\phi_{2-B}$, and $\phi_{3-D}$ clock phases. The vertical interlacing of the pixels in the two sets of alternate fields should be apparent from comparison of SUBFIGS. 2(a) and 2(a'). The charge packet 23 accumulated as the topmost field pixel of a field in the first set of alternate fields is depicted in SUBFIG. 2(a) as a stippled "fluid" in a potential well, and the charge packet 24 accumulated as the top most full pixel of a field in the second set of alternate fields is similarly depicted in SUBFIG. 2(a'). This depiction facilitates one's observing the progress of the transfer of charge from image register portion 21 to field storage register portion 22 during the field transfer intervals succeeding the SUBFIG. 2(a) and 2(a') image integration intervals.

The dynamic clocking of field storage register portion 22 during image integration takes place at line advance rate in three phases $\phi_{1-B}$, $\phi_{2-B}$, and $\phi_{3-B}$ respectively supplied from clocking generator 15 to the gate electrodes labelled as being receptive of $\phi_1$, $\phi_2$, and $\phi_3$ signals. The high rate of this dynamic clocking respective to image integration interval rate is the reason for showing the channel potentials under the $\phi_1$, $\phi_2$, and $\phi_3$ gate electrodes as ranges of potential.

The sequence of SUBFIGS. 2(b)–2(h) shows successive charge profiles associated with the dynamic clocking of register portions 21 and 22 at the outset of each field transfer interval following image integration during either the first set or the second set of alternate fields. Charge packet 25 corresponds to accumulated charge packet 23 of SUBFIG. 2(a) in the first set of alternate fields and to accumulated charge packet 24 in the second set of alternate fields. The similarity of charge transfer in both the first and second sets of alternate fields is implemented by applying $\phi_{1-A}$ to the gate electrodes labelled as being receptive of $\phi_A$ and $\phi_D$ signals, by applying $\phi_{2-A}$ to the gate electrodes labelled as being receptive of $\phi_B$ signal, and by applying $\phi_{3-A}$ to the gate electrodes labelled as being receptive of $\phi_C$ signal. The initial clock condition in SUBFIG. 2(b) is chosen to be the one where $\phi_{1-A}$ and $\phi_{3-A}$ are receptive of barrier-inducing voltage from source 17. This retards the spatial phase of charge packets accumulated in the first field and advances the spatial phase of charge packets in the second field to bring the charge packets into spatial and temporal alignment for field transfer and for the subsequent clocking through B register 12 and C register 13.

Figure 3:
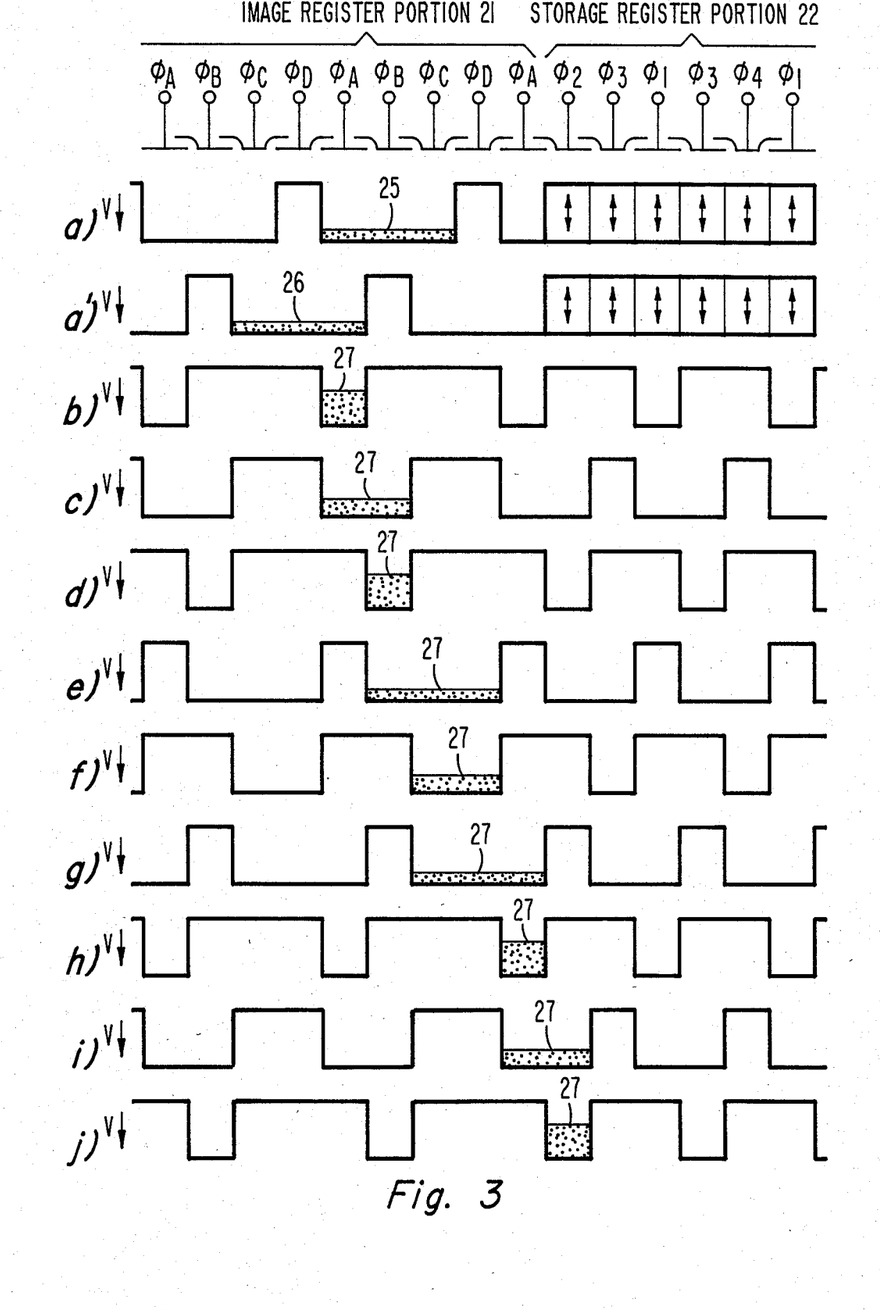

FIG. 3 shows successions of charge profiles for the other preferred way of implementing four-phase static clocking with alternate-field line interlace during image integration, together with three-phase dynamic clocking during field transfer, with regard to image register 11. SUBFIG. 3(a) shows barrier potentials induced under $\phi_D$ gate electrodes during the first set of alternate fields responsive to multiplexer circuitry 16 connecting them to voltage source 17 and connecting the other $\phi_A$, $\phi_B$ and $\phi_C$ gate electrodes to voltage source 18. Charge packet 26 is representative of the first-full pixel image sample in the first set of alternate fields. SUBFIG. 5(a') shows barrier potentials induced under $\phi_B$ gate electrodes during the second set of alternate fields responsive to multiplexer circuitry 16 connecting them to voltage source 17 and connecting the other $\phi_A$, $\phi_C$ and $\phi_D$ gate electrodes to voltage source 18. Charge packet 27 is representative of the first full-pixel image in this second set of alternate fields. Note the correspondence of the dynamic clocking during field transfer intervals following SUBFIG. 3(a) or 3(a') image integration interval, as depicted in SUBFIGS. 3(b-3(j). In this dynamic clocking $\phi_A = \phi_{1-A}$, $\phi_B = \phi_{2-A}$ and $\phi_C = \phi_D = \phi_{3-A}$. Charge packet 28 corresponds to accumulated charge packet 26 of SUBFIG. 3(a) in the first set of alternate fields and to accumulated charge packet 27 of SUBFIG. 3(a') in the second set of alternate fields.

Figure 4:
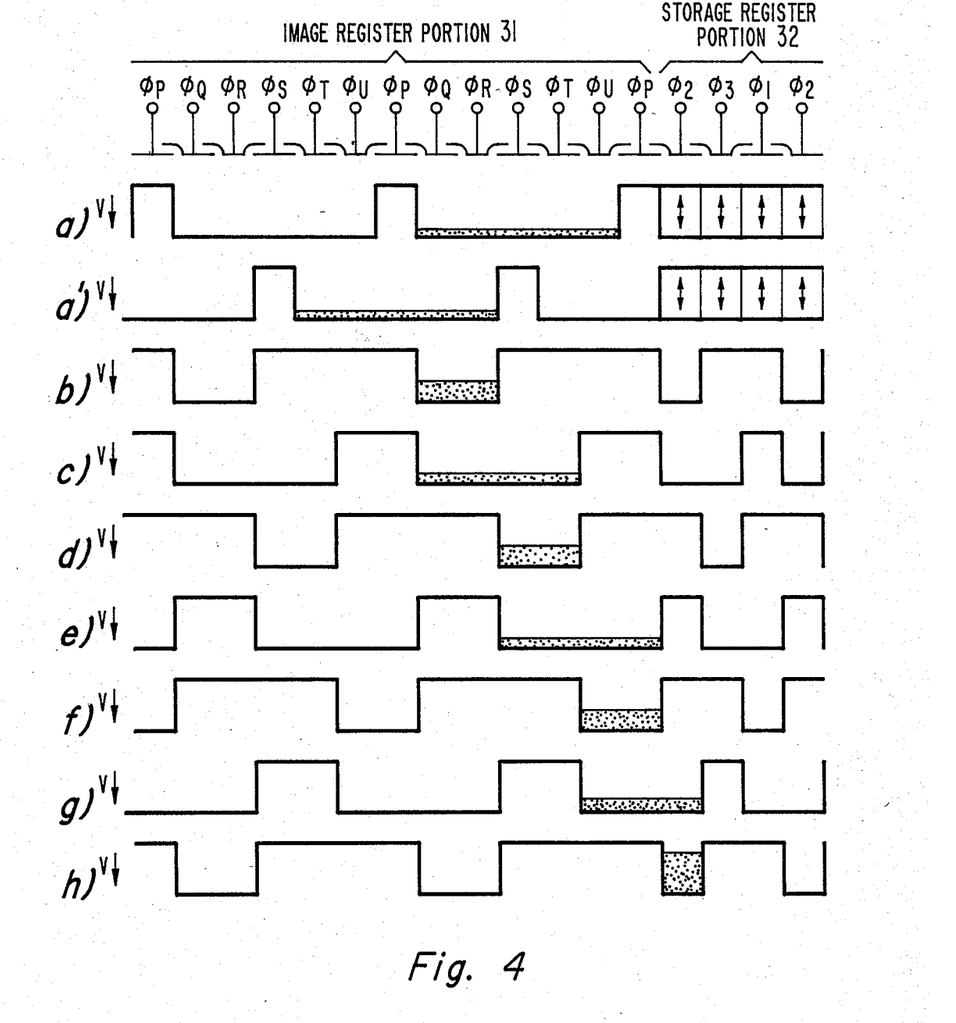
FIGS. 4, 5 and 6 show alternative paired sets of in-channel charge profiles occurring during alternate fields when the image register is operated six-phase during image integration and three-phase during image transfer.
Figure 5:
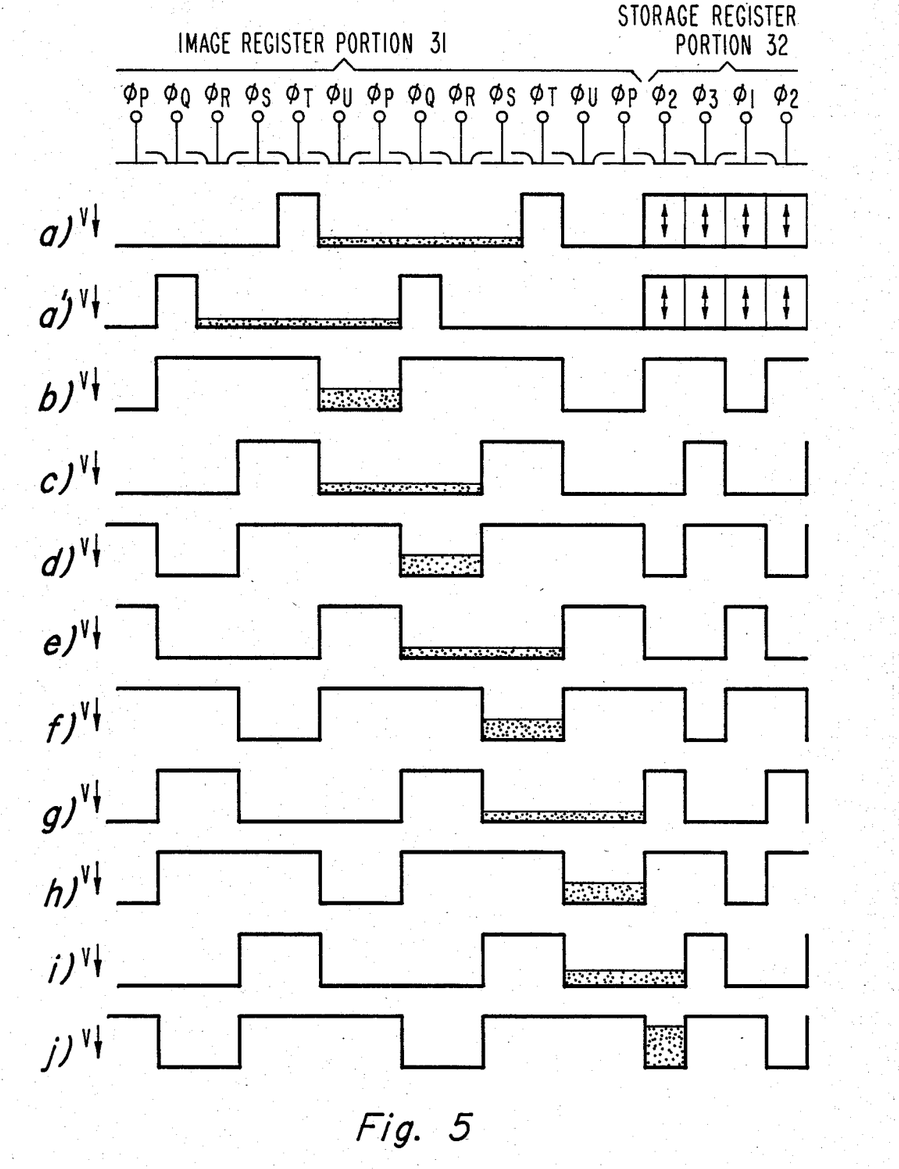
Figure 6:
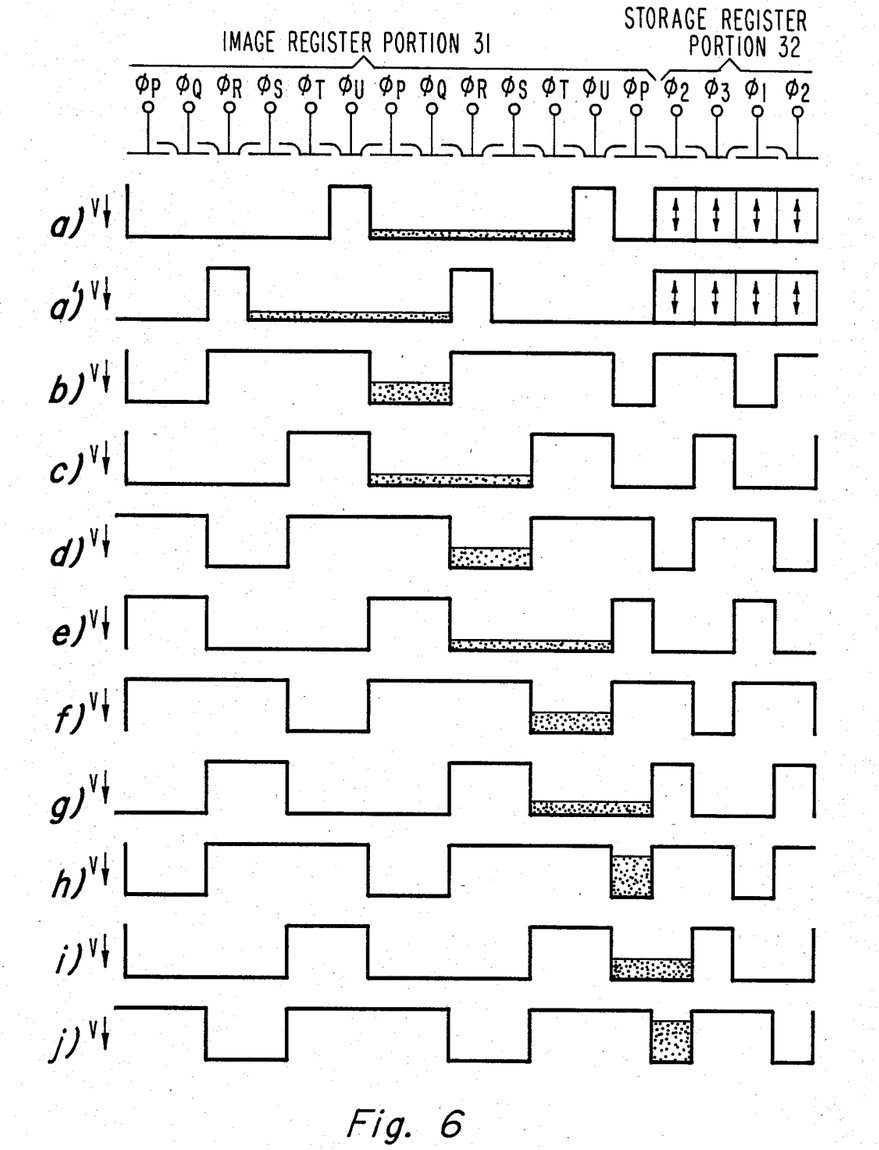

The remaining FIGS. 4, 5 and 6 show the final portion 31 of image register 11 arranged for six-phase static clocking during image integration and for three-phase dynamic clocking during field transfer, and they show the initial portion 32 of three-phase field storage register 12. The last gate electrode of image register 11 and every sixth preceding gate electrode is receptive of $\phi_P$ signal. The earlier $\phi_P$ gate electrodes are followed cyclically by gate electrodes receptive of $\phi_Q$, $\phi_R$, $\phi_S$, $\phi_T$ and $\phi_U$ signals.

FIG. 4 shows a first of the three preferred ways to provide for line interlace between first and second sets of alternate fields. SUBFIG. 4(a) shows image integration between barrier potentials induced under the last gate electrode and every sixth preceding gate electrode (those labelled receptive of $\phi_P$ signal) responsive to multiplexer circuitry 16 connecting them to voltage source 17 during a first set of alternate fields. SUBFIG. 4(a') shows image integration between barrier potentials induced under gate electrodes receptive of $\phi_S$ signal during a second set of alternate fields time-interleaved with the first set. SUBFIGS. 4(b)-4(h) show subsequent dynamic clocking during field transfer. In this dynamic clocking $\phi_U = \phi_P = \phi_{1-A}$, $\phi_Q = \phi_R = \phi_{2-A}$, and $\phi_S = \phi_T = \phi_{3-A}$.

FIG. 5 shows the second preferred way of clocking image register portion 31. In SUBFIGS. 5(a) and 5(a') multiplexer circuitry 16 connects barrier-inducing voltage source 17 to gate electrodes receptive of $\phi_T$ clock phase during image integration in the first set of alternate fields and to gate electrodes receptive of $\phi_Q$ clock phase during image integration in the second set of alternate fields. SUBFIGS. 5(b)-5(j) show successive steps in the dynamic three phase clocking of the image register portion 31 during subsequent field transfer. In this dynamic clocking also $\phi_U = \phi_P = \phi_{1-A}$, $\phi_Q = \phi_R = \phi_{2-A}$, and $\phi_S = \phi_T = \phi_{3-A}$.

FIG. 6 shows the third preferred way of clocking image register portion 31. In SUBFIGS. 6(a) and 6(a') multiplexer circuitry 16 connects barrier-inducing voltage source 17 to gate electrodes receptive of $\phi_U$ signal during image integration in the first set of alternate fields and to gate electrodes receptive of $\phi_R$ signal during image integration in the second set of alternate fields. SUBFIGS. 6(b)-6(j) show successive steps in the dynamic three phase clocking of the image register portion 31 during subsequent field transfer. In this dynamic clocking also $\phi_U = \phi_P = \phi_{1-A}$, $\phi_Q = \phi_R = \phi_{2-A}$, and $\phi_S = \phi_T = \phi_{3-A}$.

What is claimed is:

1. A CCD imager comprising:
   a field storage CCD register shielded from illumination, provided with a plurality of gate electrodes consecutively ordinally numbered first through $m^{th}$ in consecutive cycles of m successive gate electrodes, and clocked during recurrent field transfer intervals in m successive phases successively ordinally numbered first through $m^{th}$ and applied to gate electrodes of the field storage register with corresponding ordinal number;
   means for reading out from said field storage register during field trace intervals between each pair of successive field transfer intervals; and
   an image CCD register exposed to illumination by images during image integration intervals between field transfer intervals and provided with a plurality of gate electrodes consecutively ordinally numbered first through $n^{th}$ in consecutive cycles of n successive gate electrodes, with n being a larger positive integer than m, said image CCD register being statically clocked during image integration intervals to place barrier-inducing potential only on its gate electrodes of a given ordinal numbering and being dynamically clocked during field transfer intervals in only m phases by grouping certain of its similarly ordinally numbered gate electrodes together with other similarly ordinally numbered gate electrodes all to receive the same clock phasing.

2. A CCD imager as set forth in claim 1 wherein the gate electrodes in said image register are not substantially longer than seven microns to keep grain acceptably low, wherein m is three, and wherein n is four.

3. A CCD imager as set forth in claim 2 wherein during a first set of alternate field trace intervals barrier-inducing potential is applied to gate electrodes in said image register with ordinal numbering differing by two from the gate electrodes to which barrier-inducing potential is applied during a second set of alternate field trace intervals time-interleaved with said first set of alternate field trace intervals.

4. A CCD imager as set forth in claim 3 wherein the grouping of certain of the similarly ordinally numbered gate electrodes in said image register and the clock phase relationship at the start-up of dynamic clocking during field transfer interval are chosen so that dynamic clocking is the same for field transfer intervals following field trace intervals in both said first and second sets of alternate field trace intervals.

5. A CCD imager as set forth in claim 1 wherein the gate electrodes in said image register are not substantially longer than seven microns to keep grain acceptably low, wherein m is three, and wherein n is six.

6. A CCD imager as set forth in claim 5 wherein during a first set of alternate field trace intervals barrier-inducing potential is applied to gate electrodes in said image register with ordinal numbering differing by three from the gate electrodes to which barrier inducing potential is applied during a second set of alternate field trace intervals time-interleaved with said first set of alternate field trace intervals.

7. A CCD imager as set forth in claim 6 wherein the grouping of certain of the similarly ordinally numbered gate electrodes in said image register and the clock phase relationship at the start-up of dynamic clocking during field transfer interval are chosen so that dynamic clocking is the same for field transfer intervals following field trace intervals in both said first and second sets of alternate field trace intervals.

8. A CCD imager having therein:
   a first charge transfer channel shielded along its entire length from illumination, provided with an input port and an output port, crossed along its length by a first succession of gate electrodes consecutively ordinally numbered first through $m^{th}$ in each of successive cycles of m successive gate electrodes, and clocked during recurrent charge transfer intervals in m successive-in-time phases ordinally numbered first through $m^{th}$ and applied to gate electrodes with corresponding ordinal number;
   a second charge transfer channel exposed to illumination by radiant energy along at least a portion of its length during image integration intervals between charge transfer intervals, provided with an output port connecting to the input port of said first charge transfer, and crossed along its length by a second succession of gate electrodes consecutively ordinally numbered first through $n^{th}$ in each of successive cycles of n successive gate electrodes with n being a positive integer larger than m, said second charge transfer channel being statically clocked during image integration intervals to place barrier-inducing potential only on its electrodes of a given ordinal numbering and being dynamically clocked during charge transfer intervals in only m phases by grouping certain of its similarly numbered gate electrodes with other similarly numbered gate electrodes all to receive the same clock phasing;
   a charge sensing device for sensing the amplitude of charge packets conveyed to its input port; and
   means for conveying charge packets clocked from the output port of said first charge transfer channel to the input port of said charge sensing device.

* * * * *